(12) United States Patent
Tomita et al.

(10) Patent No.: US 7,719,915 B2
(45) Date of Patent: May 18, 2010

(54) SEMICONDUCTOR MEMORY DEVICE INCLUDING A TERMINAL FOR RECEIVING ADDRESS SIGNAL AND DATA SIGNAL

(75) Inventors: Hiroyoshi Tomita, Kawasaki (JP); Shusaku Yamaguchi, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 649 days.

(21) Appl. No.: 11/653,338

(22) Filed: Jan. 16, 2007

(65) Prior Publication Data
US 2007/0109897 A1 May 17, 2007

Related U.S. Application Data

(63) Continuation of application No. PCT/JP2004/010210, filed on Jul. 16, 2004.

(51) Int. Cl.
*G11C 7/00* (2006.01)
(52) U.S. Cl. .................. 365/222; 365/201; 365/230.08; 365/236
(58) Field of Classification Search .................. 365/201, 365/222, 230.08, 236
See application file for complete search history.

(56) References Cited

U.S. PATENT DOCUMENTS

| 6,272,053 | B1 | 8/2001 | Choi |
| 2001/0010653 | A1 | 8/2001 | Wakasugi et al. |
| 2001/0017811 | A1 | 8/2001 | Ikeda et al. |
| 2001/0050578 | A1 | 12/2001 | Yamamoto |
| 2003/0026161 | A1* | 2/2003 | Yamaguchi et al. .... 365/230.03 |
| 2003/0198098 | A1* | 10/2003 | Fujioka et al. .............. 365/200 |
| 2004/0027876 | A1 | 2/2004 | Takahashi et al. |
| 2004/0042311 | A1 | 3/2004 | Ikeda |

FOREIGN PATENT DOCUMENTS

| EP | 1 394-806 A2 | 3/2004 |
| JP | 11-328971 | 11/1999 |
| JP | 2001-216800 | 8/2001 |
| JP | 2001-243765 | 9/2001 |
| JP | 2001-344997 | 12/2001 |
| JP | 2002-184174 | 6/2002 |
| JP | 2004-87048 | 3/2004 |

\* cited by examiner

*Primary Examiner*—Hoai V Ho
(74) *Attorney, Agent, or Firm*—Fujitsu Patent Center

(57) ABSTRACT

A multipurpose terminal receives an address signal and a data signal. An address valid terminal receives an address valid signal indicating that a signal supplied to the multipurpose terminal is the address signal. An arbiter determines which of an external access request and an internal refresh request is given priority. The arbiter disables reception of the internal fresh request in response to a fact that both a chip enable signal and the address valid signal reach a valid level (an external access request). The arbiter enables the reception of the internal refresh request in response to completion of read or write operation. As a result, in a semiconductor memory device including the multipurpose terminal which receives the address signal and the data signal, contention between the read operation and the write operation, and a refresh operation which responds to the internal refresh request is prevented, which prevents a malfunction.

14 Claims, 13 Drawing Sheets

SEMICONDUCTOR MEMORY DEVICE INCLUDING A TERMINAL FOR RECEIVING ADDRESS SIGNAL AND DATA SIGNAL

CROSS REFERENCE TO RELATED APPLICATION

This application is continuation application of International Application PCT/JP2004/010210, filed Jul. 16, 2004, and designation the U.S.

BACKGROUND OF THE INVENTION

1. Field of the Invention

The present invention relates to a semiconductor memory device which includes a multipurpose terminal receiving an address signal and a data signal and automatically refreshes a memory cell.

2. Description of the Related Art

In recent years, a semiconductor memory called a pseudo-SRAM has been attracting attention. The pseudo-SRAM includes DRAM memory cells (dynamic memory cells) and operates as an SRAM by internally automatically performing a refresh operation of the memory cells. The dynamic memory cell is small in area. Therefore, the pseudo-SRAM with a low cost per bit and a large capacity can be developed.

The pseudo-SRAM generates an internal refresh request to perform the refresh operation in a predetermined cycle independently of (in asynchronization with) an external access request (read request or write request.) In Japanese Unexamined Patent Application Publication No. 2001-243765, a pseudo SARM with a built-in arbiter which determines priority between the internal refresh request and the external access request to prevent a collision between the refresh operation and an access operation is described.

Meanwhile, a semiconductor memory device which receives an address signal and a data signal at the same terminal is proposed. The formation of a multipurpose terminal reduces the number of terminals, which reduces a chip size and thereby lowers the manufacturing cost. This type of semiconductor memory device includes an address valid terminal which receives an address valid signal to recognize that the address signal is supplied to the multipurpose terminal. A system which accesses the semiconductor memory device sets the address valid terminal to a valid level when supplying the address signal to the multipurpose terminal, and sets the address valid terminal to an invalid level when supplying the data signal to the multipurpose terminal.

The present invention is made to solve the following problems which arise when a multipurpose terminal receiving an address signal and a data signal is provided in a pseudo-SRAM.

Generally, when receiving activation of a chip enable signal, the pseudo-SRAM recognizes an external access request. A system which accesses the pseudo-SRAM needs to supply an access address at the time of the external access request. Accordingly, if the multipurpose terminal is formed in the pseudo-SRAM, the system needs to set an address valid terminal, together with a chip enable terminal, to a valid level when accessing the pseudo-SRAM. In other words, in a state where the chip enable terminal is fixed to the valid level, the address valid signal is recognized as the external access request.

However, the above arbiter of the pseudo-SRAM recognizes the external access request by only the chip enable signal. Therefore, when the chip enable signal is fixed to the valid level, the arbiter cannot recognize the external access request and continues to give priority to a refresh request. This causes contention between a refresh operation and an access operation, and thereby the pseudo-SRAM malfunctions.

When the address signal is received by the multipurpose terminal, the valid period of the address signal becomes shorter. A semiconductor memory device malfunctions if an erroneous address signal is incorporated thereto. Further, when an internal circuit of the semiconductor memory device is operated using the address signal with a short valid period, the timing margin of the internal circuit reduces, which makes a circuit design difficult. If the timing margin reduces, the semiconductor memory device becomes more likely to be affected by a change in manufacturing condition, resulting in a decrease in yield.

In the pseudo-SRAM, an external address signal or an internally generated refresh address signal needs to be selected as the address signal to be supplied to a memory cell array depending on whether the access operation is performed or the refresh operation is performed. If the valid period of the external address is short, the timing margin to select the address signal reduces. If the erroneous address signal is selected, the semiconductor memory device malfunctions.

When a semiconductor memory device which includes the multipurpose terminal receiving the address signal and the data signal is newly designed, a design cost and a manufacturing cost of a photomask and so on are newly required. These costs are reduced by appropriating already existing design property.

SUMMARY OF THE INVENTION

An object of the present invention is to prevent contention between a refresh operation and an access operation to prevent a malfunction in a semiconductor memory device which includes a multipurpose terminal receiving an address signal and a data signal and automatically performs refresh.

Another object of the present invention is to certainly receive an address signal supplied to a multipurpose terminal receiving an address signal and a data signal to prevent a malfunction of a semiconductor memory device.

Still another object of the present invention is to certainly switch an address signal received via a multipurpose terminal and a refresh address signal generated inside a semiconductor memory device to perform an access operation and a refresh operation.

Yet another object of the present invention is to easily manufacture a semiconductor memory device which includes a multipurpose terminal receiving an address signal and a data signal.

In a first aspect of a semiconductor memory device of the present invention, a multipurpose terminal receives an address signal and a data signal. An address valid terminal receives an address valid signal indicating that a signal supplied to the multipurpose terminal is the address signal. An access detection circuit detects an external access request to a dynamic memory cell indicated by the address signal when both a chip enable signal and the address valid signal reach a valid level.

An arbiter determines which of the external access request and an internal refresh request is given priority. The arbiter disables reception of the internal refresh request generated by a refresh request circuit in response to the detection by the access detection circuit. Further, the arbiter enables the reception of the internal refresh request in response to completion of a read operation or a write operation in accordance with the received chip enable signal and address valid signal. Consequently, it is able to prevent contention between the read write operations and a refresh operation which responds to the internal refresh request in the semiconductor memory device which includes the multipurpose terminal receiving the address signal and the data signal, and the address valid terminal, which can prevent a malfunction.

In a preferred example of the first aspect of the semiconductor memory device of the present invention, an access command terminal receives at least either of a read command to read data from a memory cell and a write command to write data into a memory cell. A latch signal generation circuit activates a first address latch signal in response to the detection by the access detection circuit. A first address latch circuit receives and latches the address signal in response to the activation of the first address latch signal and outputs it as an external address signal. A second address latch circuit latches the external address signal in synchronization with the read command or the write command and outputs the latched signal to a memory cell array.

When the address signal is received via the multipurpose terminal, the valid period of the address signal is shorter than that when an exclusive terminal is used. By temporarily latching the address signal received by the multipurpose terminal by the first address latch circuit, it becomes possible to certainly receive the address signal and generate the external address signal with a long valid period even when the valid period of the address signal is short. This makes it possible to prevent a malfunction of the semiconductor memory device caused by a defective latch of the address signal. Further, the set-up time and hold time of the address signal inputted to the multipurpose terminal can be set to a minimum, thereby enabling a reduction in access time.

In a second aspect of the semiconductor memory device of the present invention, an exclusive address terminal receives an address signal. An arbiter determines which of an external access request and an internal refresh request is given priority. A specification setting unit sets an operating specification to either of a first specification and a second specification.

The semiconductor memory device set to the first specification receives only a data signal by a multipurpose terminal while an address valid terminal is made invalid, and makes the exclusive address terminal valid. The arbiter disables reception of an internal refresh request when detecting that a chip enable signal is at a valid level. Further, the arbiter enables the reception of the internal refresh request in response to completion of a read operation or a write operation in accordance with the received chip enable signal.

The semiconductor memory device set to the second specification performs the same operation as in the above first aspect. This can prevent contention between the read write operations and a refresh operation which responds to the internal refresh request, which can prevent a malfunction. Further, in this semiconductor memory device, the operating specification can be changed according to the setting of the specification setting unit, so that two products with different operating specifications can be manufactured from one piece of design data. As a result, the development cost and manufacturing cost of the semiconductor memory device can be reduced.

In a preferred example of the second aspect of the semiconductor memory device of the present invention, the semiconductor memory device includes an access command terminal, a latch signal generation circuit, a first and second address latch circuits having the same functions as in the above first aspect. The second address latch circuit latches the address signal in the first specification, and latches the external address signal in the second specification. Accordingly, the semiconductor memory device set to the second specification has the same characteristic as in the above first aspect. Namely, the malfunction of the semiconductor memory device caused by the defective latch of the address signal can be prevented, and the access time can be reduced.

In a preferred example of the second aspect of the semiconductor memory device of the present invention, the specification setting unit includes a conductive layer formed at a predetermined position on a semiconductor substrate in accordance with a pattern shape of a photomask used in a semiconductor manufacturing process. The operating specification is set to the first specification or the second specification according to a signal path formed of the conductive layer. Accordingly, the product specification (operating specification) of the semiconductor memory device can be switched optimally according to the used photomask. Since a circuit to switch the operating specification is unnecessary, the chip size of the semiconductor memory device can be minimized.

In a preferred example of the second aspect of the semiconductor memory device of the present invention, the specification setting unit includes a program circuit. The operating specification is set to the first specification or the second specification according to information programmed in the program circuit. Accordingly, the product specification (operating specification) of the semiconductor memory device can be set after the semiconductor memory device is manufactured. With the semiconductor memory device switchable to the first or the second specification and manufacturable in advance, it is possible to quickly cope with change in production plan (shipping plan) after manufacturing.

In a preferred example of the second aspect of the semiconductor memory device of the present invention, a test mode terminal receives a test mode signal. A test terminal receives a test signal. When the test mode signal indicates a valid level, the specification setting unit switches the operating specification to either the first specification or the second specification according to a logic level of the test signal regardless of a set state of the program circuit. Accordingly, it is possible to test the semiconductor memory device while switching it to the first specification and the second specification regardless of the set state of the program circuit. For example, when a test reveals that the semiconductor memory device operates in the first specification but does not operate in the second specification, a defect can be relieved by setting this semiconductor memory device to the first specification by the program circuit. As a result, the yield can be increased, and the manufacturing cost can be reduced.

In a preferred example of the second aspect of the semiconductor memory device of the present invention, a test control circuit shifts an operating state of the semiconductor memory device to a test mode when receiving a combination of signals not used in a normal operation. During the test mode, the specification setting unit switches the operating specification to either the first specification or the second specification according to a test signal regardless of a set state of the program circuit. Also in this semiconductor memory device, similarly to the above, the yield can be increased, and the manufacturing cost can be reduced.

In a preferred example of the first and second aspects of the semiconductor memory device of the present invention, a refresh address counter sequentially generates refresh address signals each indicating a memory cell to be refreshed, in synchronization with the internal refresh request. A multiplexer is placed between the first address latch circuit and the second address latch circuit and supplies either the external address signal or the refresh address signal to the second address latch circuit. The second address latch circuit latches the address signal selected by the multiplexer. Generally, the generation cycle of the internal refresh request is sufficiently longer than the access time, so that the valid period of the refresh address signal is long. Hence, by placing the multiplexer between the first address latch circuit and the second address latch circuit, the multiplexer can have sufficient time to switch the address signal. Since the timing margin of the internal circuit can be secured, the malfunction of the semiconductor memory device can be prevented, which increase the yield. Further, the circuit design can be easily performed.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
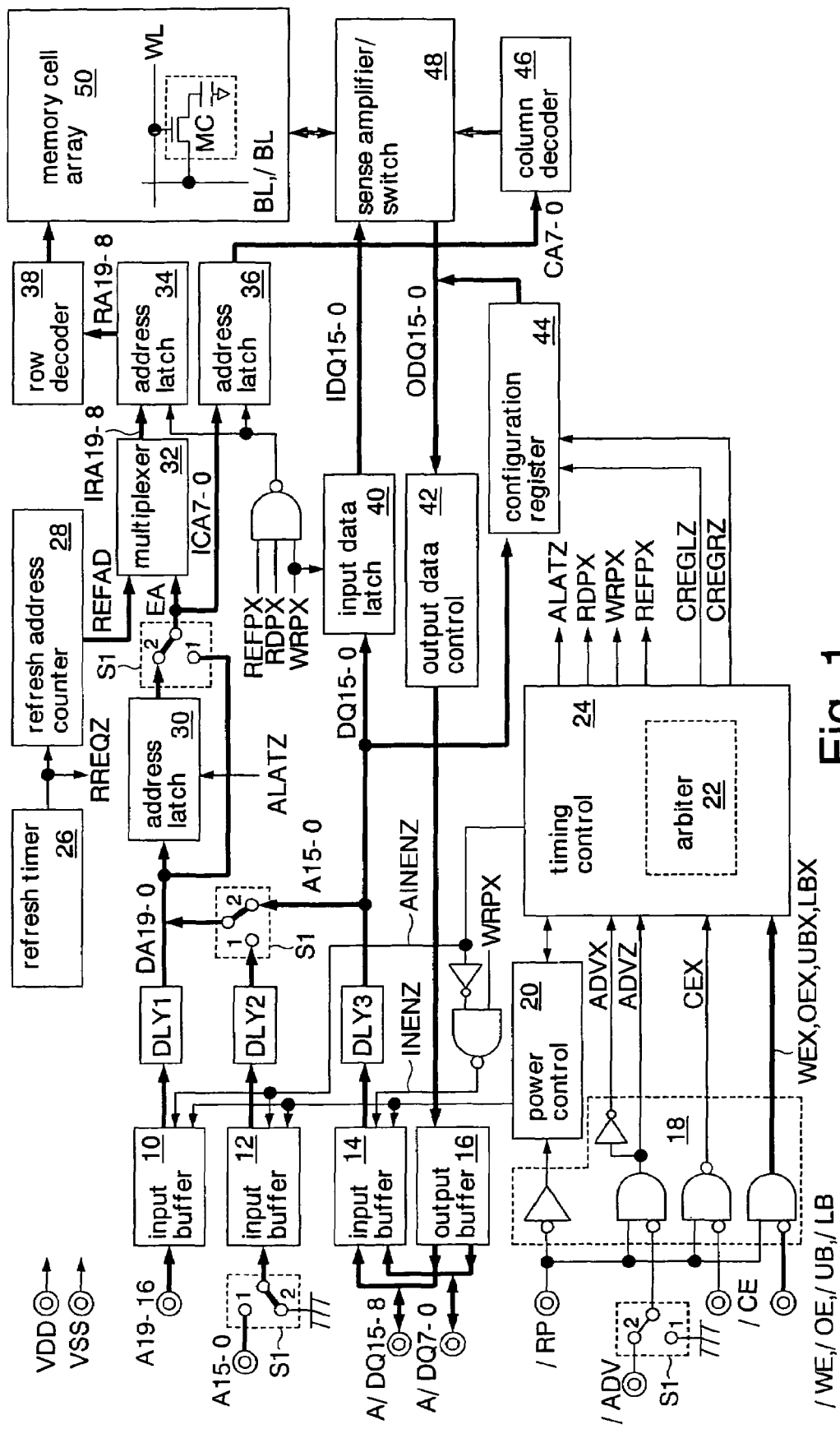
FIG. 1 is a block diagram showing a first embodiment of a semiconductor memory device of the present invention.

Hereinafter, embodiments of the present invention will be described, using the drawings. In the drawings, each double circle denotes an external terminal. Each signal line shown by a heavy line is constituted of a plurality of signal lines. Part of blocks to which the heavy lines are connected are constituted of a plurality of circuits. Each signal supplied through an external terminal is denoted by the same reference symbol as the name of the terminal. Further, each signal line through which a signal is transmitted is denoted by the same reference symbol as the name of the signal. Each signal with "Z" at the end of its name indicates positive logic. Each signal with "/" at the head of its name and each signal with "X" at the end of its name indicate negative logic.

FIG. 1 shows a first embodiment of a semiconductor memory device of the present invention. This semiconductor memory device is formed as a pseudo-SRAM on a silicon substrate using a CMOS process. The pseudo-SRAM is used, for example, for a work memory mounted in portable equipment such as a mobile phone.

The pseudo-SRAM includes input buffers 10, 12, 14, an output buffer 16, a command input circuit 18, a power control 20, a timing control 24 including an arbiter 22, delay circuits DLY1-3, a refresh timer (refresh request circuit) 26, a refresh address counter 28, a first address latch circuit 30, a multiplexer 32, second address latch circuits 34, 36, a row decoder 38, an input data latch circuit 40, an output data control 42, a configuration register 44, a column decoder 46, a sense amplifier/switch 48, a memory cell array 50, and plural specification setting units S1.

Each specification setting unit S1 is constituted of a conductive layer formed at a predetermined position on the silicon substrate in accordance with a pattern shape of a photomask used in a semiconductor manufacturing process. In this embodiment, the pseudo-SRAM whose operating specification (product specification) is a first specification or a second specification is manufactured by switching the photomask. The conductive layer is shown by a line connecting terminals (circles) of the specification setting unit S1. This example shows a case where a conductive pattern of each specification setting unit S1 is connected to terminal No. 2 and the operating specification is set to the second specification.

The pseudo-SRAM of the first specification is manufactured by constituting each specification setting unit S1 by a conductive pattern connected to terminal No. 1.

While an address input enable signal AINENZ is at a high level, the input buffer 10 is activated, receives an address signal A19-16 supplied via address terminals A19-16, and outputs the received signal to the delay circuit DLY1. As described later, the address input enable signal AINENZ is activated when both a chip enable signal /CE and an address valid signal /ADV are both at a low level (valid level, activation period). The address terminals A19-16 are exclusive address terminals which receive only the address signal A19-16 indicating a memory cell MC to be accessed.

While the address input enable signal AINENZ is at the high level, the input buffer 12 is activated, receives an address signal A15-0 supplied via address terminals A15-0, and outputs the received signal to the delay circuit DLY2. The address terminals A15-0 are exclusive address terminals which receive only the address signal A15-0 indicating the memory cell MC to be accessed.

The specification setting unit S1 connected to an input of the input buffer 12 supplies a ground voltage (fixed level) when the operating specification (product specification) is set to the second specification, and connects the input buffer 12 to the respective address terminals A15-0 when the operating specification is set to the first specification. As just described, the input buffer 12 is used only when the operating specification (product specification) is set to the first specification by the specification setting unit S1 and receives the address signal A15-0.

The input buffer 14 receives only a data signal DQ15-8, DQ7-0 when the operating specification is set to the first specification, and receives the address signal A15-8, A7-0 and the data signal DQ15-8, DQ7-0 when the operating specification is set to the second specification. Namely, terminals A/DQ15-0 function as exclusive terminals of the data signal DQ in the first specification and function as multipurpose terminals of the address signal A and the data signal DQ in the second specification. While an input enable signal INENZ is at a high level, the input buffer 14 is activated, receives the address signal A15-0 and the data signal DQ15-0 supplied via the multipurpose terminals A/DQ15-8, A/DQ7-0 and outputs the received signals to the delay circuit DLY3. The input enable signal INENZ is a signal obtained by ORing an activation period of the address input enable signal AINENZ and an activation period of a write control signal WRPX.

The output buffer 16 outputs data or the like read from the memory cell MC to the outside of the pseudo-SRAM via the multipurpose terminals A/DQ15-8, A/DQ7-0. The output buffer 16 outputs the data signal DQ during activation of an output enable signal /OE.

The command input circuit 18 receives command signals supplied via external terminals (command terminals) and outputs the received signals as internal command signals to the power control 20 and the timing control 24. The external terminal functions as an access terminal which receives a read command and a write command. The command signals include a power-down signal /RP, an address valid signal /ADV, a chip enable signal /CE, a write enable signal /WE, the output enable signal /OE, an upper byte control signal /UB, and a lower byte control signal /LB. The internal command signals include internal address valid signals ADVX, ADVZ, an internal chip enable signal CEX, an internal write enable signal WEX, an internal output enable signal OEX, an internal upper byte control signal UBX, an internal lower byte control signal LBX, and so on.

The chip enable signal /CE is activated when the memory cell array 50 is accessed.

The address valid signal /ADV is activated when the signal supplied to the multipurpose terminals A/DQ is the address signal A15-0. The write enable signal /WE is activated when a write operation is performed. The output enable signal /OE is activated when a read operation is performed. The upper byte control signal /UB is activated when the data signal DQ15-8 is made valid. The lower byte control signal /LB is activated when the data signal DQ7-0 is made valid.

The power control 20 outputs control signals to the timing control 24, the input buffers 10, 12, 14, and the output buffer 16 to shift the pseudo-SRAM to a power-down mode in response to activation of the power-down signal /RP. While the power-down signal /RP is activated, the pseudo-SRAM shifts a chip state from a normal operation mode to the power-down mode. During the power-down mode, data is not held in the memory cells MC, and the internal circuits of the pseudo-SRAM stop their operations except for the command input circuit 18. Therefore, consumption current during the power-down mode is kept at several µA to several tens of µA.

The timing control 24 outputs control signals to control operations of the memory cell array 50 and the other internal circuits according to command signals. The control signals include the address input enable signal AINENZ, a first address latch signal ALATZ, a read control signal RDPX, a write control signal WRPX, a refresh control signal REFPX, a register latch signal CREGLZ, a register read signal CREGRZ, and so on. The arbiter 22 of the timing control 24 determines which of an external access request (read command and write command) and an internal refresh request (refresh request signal RREQZ) is given priority.

The delay circuits DLY1-3 have the same delay time. The delay circuits DLY1-3 delay the address signal A19-0 by a predetermined time and output it as a delayed address signal DA19-0 to allow the first address latch circuit 30 to certainly latch the address signal A19-0.

The refresh timer 26 generates the refresh request signal (internal refresh request) RREQZ, for example, in a cycle of several tens of µs. The refresh address counter 28 sequentially generates a refresh address signal REFAD indicating the memory cell MC to be refreshed in synchronization with the refresh request signal RREQZ.

The first address latch circuit 30 transfers the delayed signal DA as an external address signal EA to the multiplexer 32 while the first address latch signal ALATZ is at a high level and latches the delayed signal DA in synchronization with the falling edge of the first address latch signal ALATZ. The latched signal is outputted as the external address signal EA.

The multiplexer 32 selects the external address signal EA (more specifically, high-order bits IA19-8 corresponding to a row address) when the read operation or write operation is performed or selects the refresh address signal REFAD when the refresh operation is performed, and outputs the selected signal as an internal row address signal IRA19-8 to the second address latch circuit 34.

The second address latch circuit 34 latches the internal row address signal IRA19-8 outputted from the multiplexer 32 in synchronization with the falling edge (activation edge) of the read control signal RDPX, the write control signal WRPX, or the refresh control signal REFPX and outputs the latched signal as a row address signal RA19-8.

The second address latch circuit 36 latches an internal column address signal ICA7-0 being low-order bits of the external address signal EA19-0 in synchronization with the falling edge of the read control signal RDPX, the write control signal WRPX, or the refresh control signal REFPX and outputs the latched signal as a column address signal CA7-0.

The row decoder 38 decodes the row address signal RA19-8 to generate a row decode signal and outputs it to the memory cell array 50. The column decoder 46 decodes the column address signal CA7-0 to generate a column decode signal and outputs it to the sense amplifier/switch 48.

The input data latch circuit 40 latches the data signal DQ15-0 (write data) supplied via the input buffer 14 in synchronization with the write control signal WRPX and outputs the latched signal as an input data signal IDQ15-0 to the sense amplifier/switch 48.

The output data control 42 holds an output data signal ODQ15-0 outputted from the sense amplifier/switch 48 and the configuration register 44 and outputs it to the output buffer 16 in predetermined timing.

The configuration register 44 becomes valid when the pseudo-SRAM is set to the second specification and used to set a use area of the memory cell array. In this embodiment, the use area of the memory cell array is set to any of full, ½, ¼, ⅛ areas according to the logic level of a 2-bit data signal DQ3-2. In the first specification, the configuration register 44 cannot be accessed, and the use area of the memory cell array is always set to the full area.

In the second specification, the use area of the memory cell array is set according to the specification of a system in which the pseudo-SRAM is mounted. More specifically, the pseudo-SRAM activates the register latch signal CREGLZ by receiving a configuration register write command (hereinafter, CR write command) after power-up, and writes a logic value of the multipurpose terminals A/DQ3-2 at this time into the configuration register 44. The system is constituted, for example, by mounting the pseudo-SRAM, a microcomputer, and the like on a system substrate, and the pseudo-SRAM is accessed by the microcomputer.

The CR write command is recognized by holding the address valid signal /ADV, the upper byte control signal /UB, the lower byte control signal /LB, and the output enable signal /OE at the high level and holding the chip enable signal /CE and the write enable signal /WE at the low level.

The value set in the configuration register 44 can be read by supplying a configuration register read command (hereinafter, CR read command) to the pseudo-SRAM and activating the register read signal CREGRZ. The CR read command is recognized by holding the address valid signal /ADV, the upper byte control signal /UB, the lower byte control signal /LB, and the write enable signal /WE at the high level and holding the chip enable signal /CE and the output enable signal /OE at the low level.

The sense amplifier/switch 48 includes a sense amplifier and a column switch which are not shown. The sense amplifier operates during the read operation, the write operation, and the refresh operation, and amplifiers a voltage difference between complementary bit lines BL, /BL. The column switch is turned on in response to the column address signal CA7-0 during the read operation and the write operation, and connects the bit lines BL, /BL and a data bus line not shown.

The memory cell array 50 includes plural dynamic memory cells MC arranged in a matrix, and plural word lines WL and plural bit line pairs BL, BL/ connected to the memory cells MC. The dynamic memory cell MC is the same as a memory cell of a general DRAM, and includes a capacitor to hold data as an electric charge and a transfer transistor placed between the capacitor and the bit line BL (or /BL). A gate of the transfer transistor is connected to the word line WL.

Figure 2:
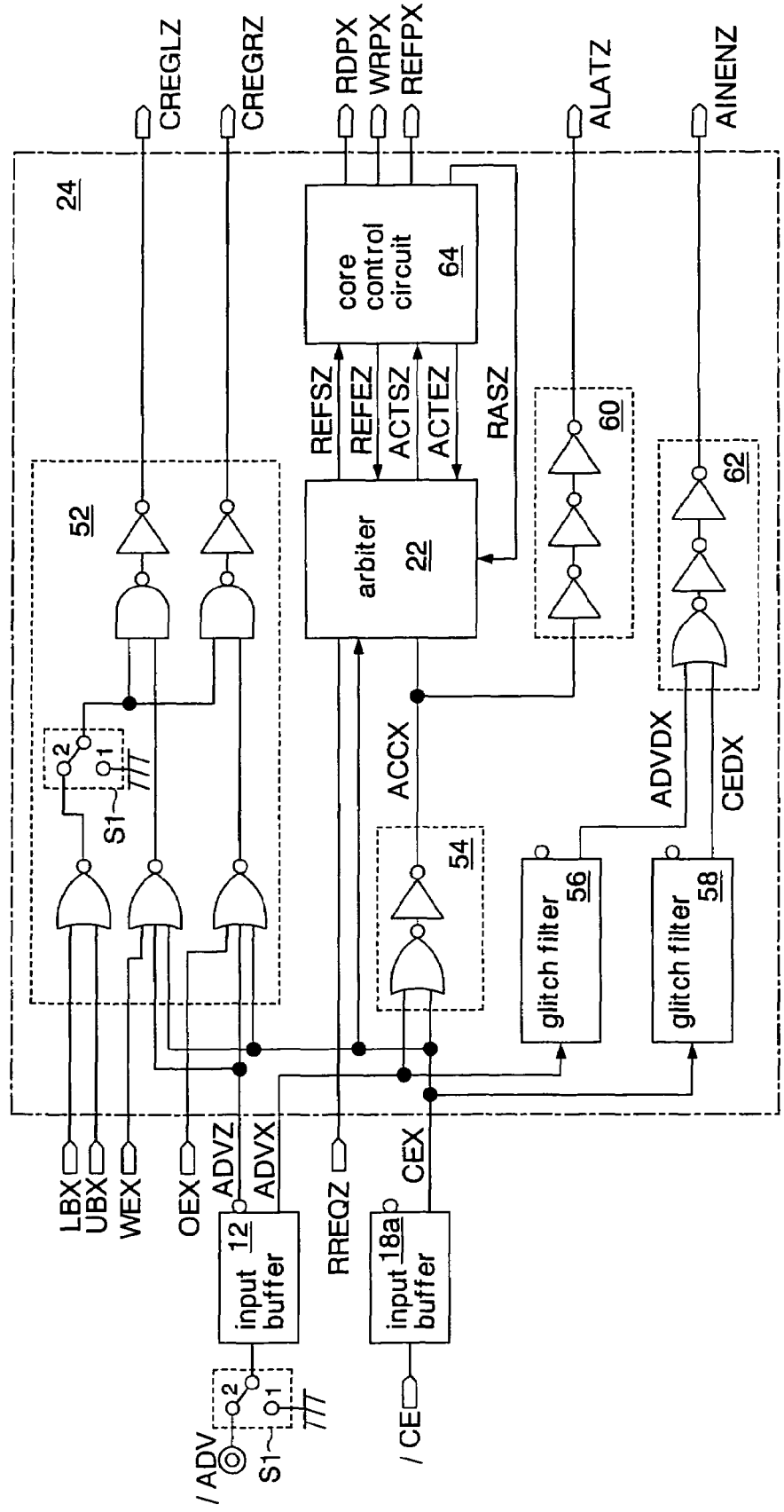
FIG. 2 is a block diagram showing details of a timing control shown in FIG. 1.

FIG. 2 shows details of the timing control 24 shown in FIG. 1. The timing control 24 includes a configuration register control circuit 52, an access detection circuit 54, glitch filters 56, 58, a latch signal generation circuit 60, an input enable generation circuit 62, a core control circuit 64, and the above arbiter 22.

When receiving a predetermined combination of command signals in the second specification as described above, the configuration register control circuit 52 activates the register latch signal CREGLZ to write data into the configuration register 44. Further, when receiving another predetermined combination of command signals in the second specification, the configuration register control circuit 52 activates the register read signal CREGRZ to read data from the configuration register 44. In the first specification, the operation of the configuration register control circuit 52 is disabled by setting of the specification setting unit S1. At this time, the register latch signal CREGLZ and the register read signal CREGRZ are always inactivated to a low level.

The access detection circuit 54 detects an external access request and activates an access request signal ACCX when both the chip enable signal /CE and the address valid signal /ADV reach the valid level (low level).

The glitch filter 56 delays the rising edge (trailing edge) of the internal address valid signal ADVX and outputs it as an internal address valid signal ADVDX. The glitch filter 58 delays the rising edge (trailing edge) of the internal chip enable signal CEX and outputs it as an internal chip enable signal CEDX.

The latch signal generation circuit 60 inverts the access request signal ACCX to generate the first address latch signal ALATZ. Namely, the first address latch signal ALATZ is activated in response to the detection of the external access request by the access detection circuit 54. At this time, the latch signal generation circuit 60 delays the activation of the first address latch signal ALATZ by a time corresponding to the delay circuits DLY1-3 shown in FIG. 1. To put it in detail, the activation timing of the first address latch signal ALATZ is set later than the activation timing of the address input enable signal AINENZ.

The input enable generation circuit 62 activates the address input enable signal AINENZ while both the internal chip enable signal CEDX and the internal address valid signal ADVDX are at the valid level (low level). The trailing edges of the internal chip enable signal CEDX and the internal address valid signal ADVDX are delayed by the glitch filters 56, 58, so that the inactivation timing of the address input enable signal AINENZ becomes later than the inactivation timing of the first address latch signal ALATZ.

The arbiter 22 activates a refresh start signal REFSZ when the refresh operation is performed and activates an access start signal ACTSZ when an access operation (read operation or write operation) is performed. Details of the arbiter 22 will be given in FIG. 3 described later.

The core control circuit 64 activates the read control signal RDPX when the read operation is performed, activates the write control signal WRPX when the write operation is performed, and activates the refresh control signal REFPX when the refresh operation is performed. The core control circuit 64 activates a refresh end signal REFEZ in response to completion of the refresh operation, and activates an access end signal ACTEZ in response to completion of the access operation. The core control circuit 64 outputs a row control signal RASZ indicating that the refresh operation and the access operation are being performed to the arbiter 22.

Figure 3:
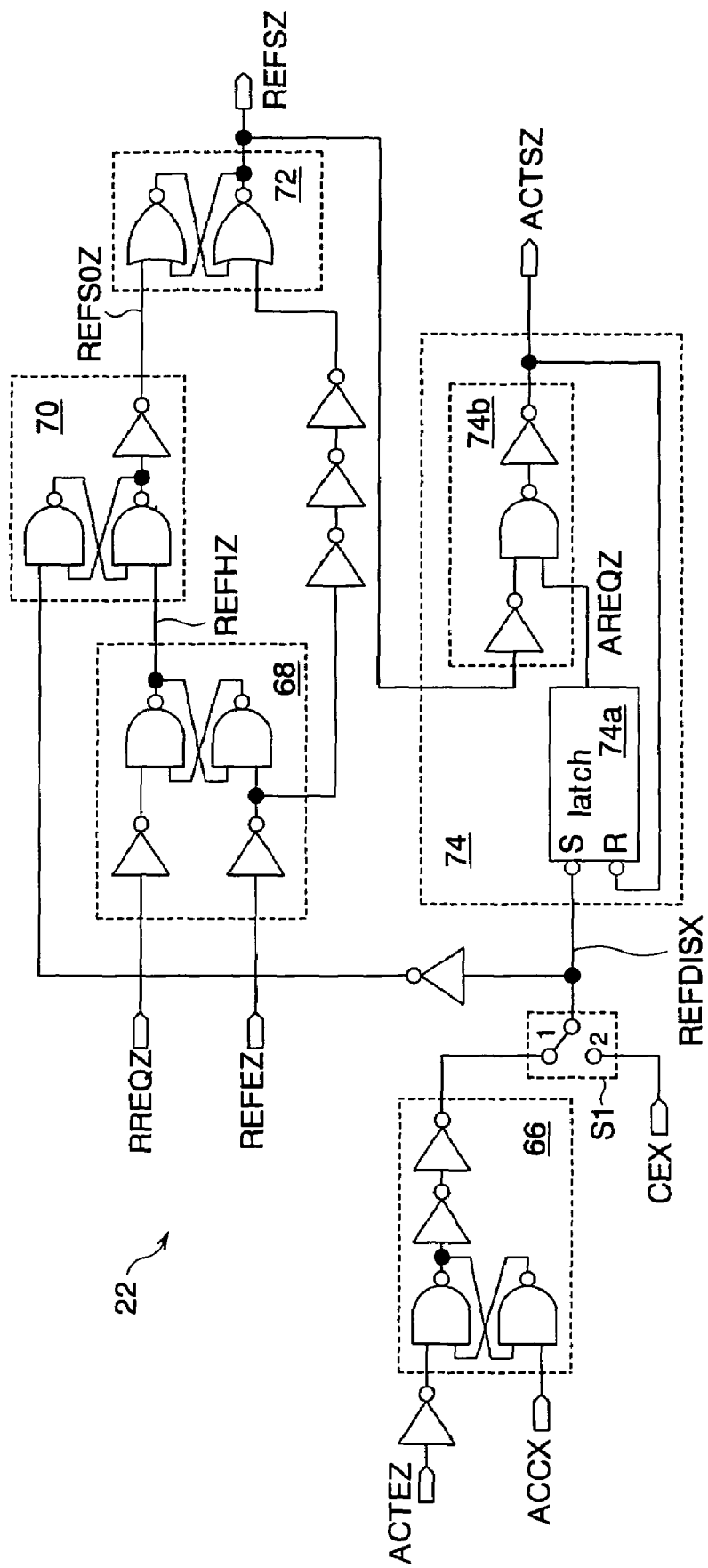
FIG. 3 is a circuit diagram showing details of an arbiter shown in FIG. 2.

FIG. 3 shows the details of the arbiter 22 shown in FIG. 2. The arbiter 22 includes a latch circuit 66, a refresh hold circuit 68, a refresh mask circuit 70, a refresh start circuit 72, and an access start circuit 74.

The latch circuit 66 is constituted of a flip-flop, activates a refresh disable signal REFDISX in synchronization with the activation of the access request signal ACCX, and inactivates the refresh disable signal REFDISX in synchronization with the activation of the access end signal ACTEZ. As described later, reception of a refresh request is disabled by the refresh disable signal REFDISX from the detection of the external access request by the access detection circuit 54 shown in FIG. 2 till completion of the read operation or the write operation corresponding to this external access request.

The refresh hold circuit 68 is constituted of a flip-flop, activates a refresh hold signal REFHZ in synchronization with the activation of the refresh request signal RFEQZ, and inactivates the refresh hold signal REFHZ in synchronization with the activation of the refresh end signal REFEZ.

The refresh mask circuit 70 is constituted of a flip-flop, and disables an output of a refresh start signal REFS0Z while the refresh disable signal REFDISX is at a low level (during a refresh disable period). The refresh mask circuit 70 activates the refresh start signal REFS0Z in response to a change of the refresh disable signal REFDISX to a high level (transition from refresh disable to refresh enable) when the refresh request is held in the refresh hold circuit 68.

The refresh start circuit 72 activates the refresh start signal REFSZ in synchronization with the activation of the refresh start signal REFS0Z, and inactivates the refresh start signal REFSZ in synchronization with the activation of the refresh end signal REFEZ. The core control circuit 64 shown in FIG. 2 starts performance of the refresh operation in response to the activation of the refresh start signal REFSZ.

The access start circuit 74 includes a latch circuit 74a and a mask circuit 74b. The latch circuit 74a is set in synchronization with a change of the refresh disable signal REFDISX to the low level to activate an access request signal AREQZ. The latch circuit 74a is reset in synchronization with the activation of the access start signal ACTSZ to inactivate the access request signal AREQZ. The mask circuit 74b masks the activation of the access start signal ACTSZ in response to the access request signal AREQZ during the activation of the refresh start signal REFSZ. The mask circuit 74b activates the access start signal ACTSZ in response to the access request signal AREQZ during the inactivation of the refresh start signal REFSZ.

Figure 4:
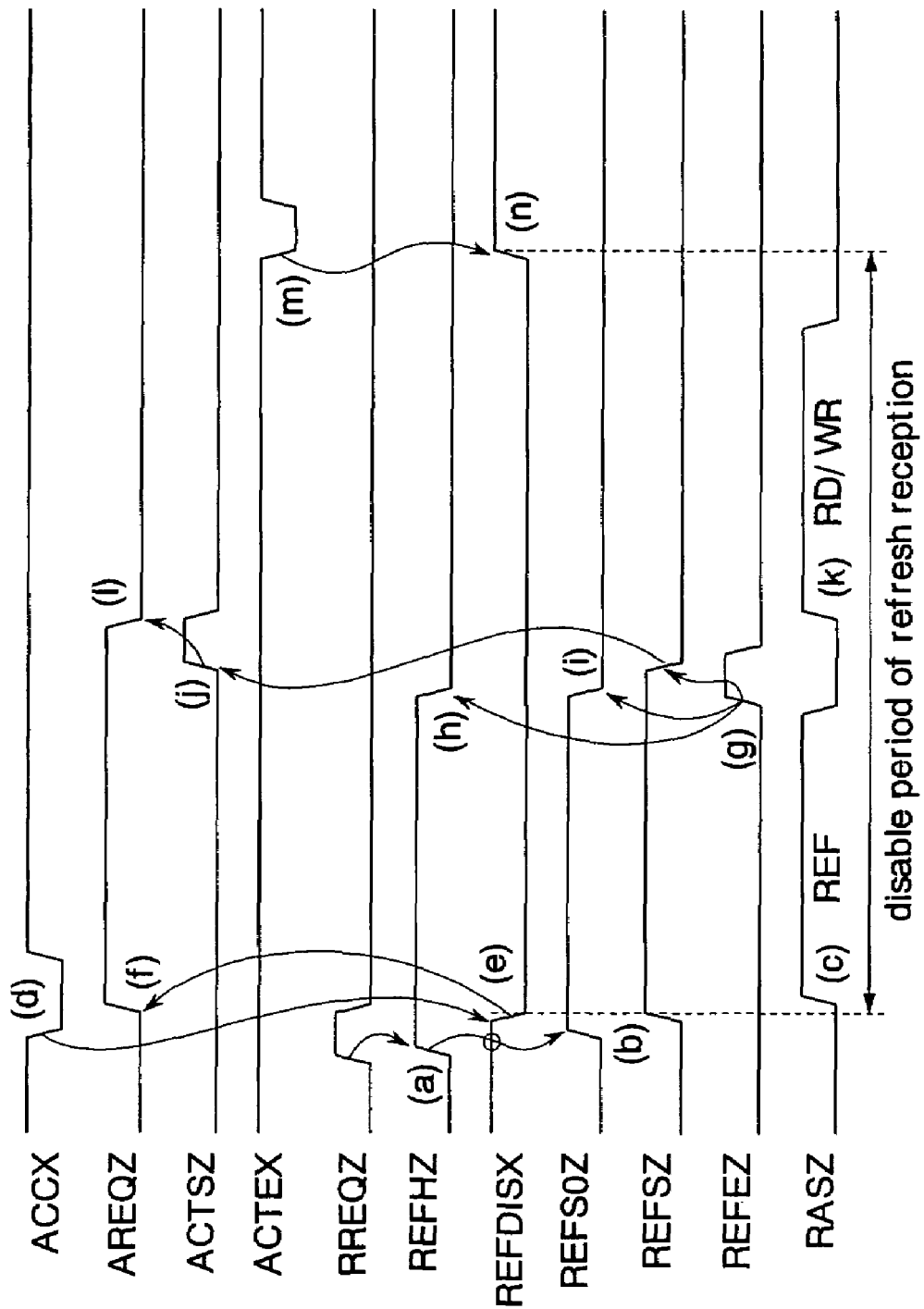
FIG. 4 is a timing chart showing an operation of an arbiter of a pseudo-SRAM set to a second specification in the first embodiment.

FIG. 4 shows an operation of the arbiter 22 of the pseudo-SRAM set to the second specification in the first embodiment. In this example, the pseudo-SRAM generates the refresh request RREQZ immediately before receiving an access request (read command RD or write command WR).

First, the refresh hold signal REFHZ is activated to a high level in response to the refresh request RREQZ (FIG. 4(a)). At this time, no access request is generated, so that the refresh disable signal REFDISX is in an inactivation state. Namely, the reception of the refresh request RREQZ is enabled. Accordingly, in response to the refresh request RREQZ, the start signals REFS0Z, REFSZ are sequentially activated (FIG. 4(b)), and the refresh operation REF is performed (FIG. 4(c)).

After the refresh request RREQZ is generated, the access request is supplied, and the access request signal ACCX is activated to a low level (FIG. 4(d)). In response to the activation of the access request signal ACCX, the refresh disable signal REFDISX is activated to the low level (FIG. 4(e)). While the refresh disable signal REFDISX is activated, the reception of the refresh request RREQZ is disabled. In synchronization with the activation of the refresh disable signal REFDISX, the access request signal AREQZ is activated (FIG. 4(f)). At this time, since the refresh start signal REFSZ is activated, the access start signal ACTSZ is not activated.

The refresh end signal REFEZ is outputted in synchronization with completion of the performance of the refresh operation REF (FIG. 4(g)). In synchronization with the refresh end signal REFEZ, the refresh hold signal REFHZ is inactivated (FIG. 4(h)). Simultaneously, the refresh start signals REFS0Z, REFSZ are inactivated (FIG. 4(i)). In response to inactivation of the refresh end signal REFEZ, the access start signal ACTSZ is activated (FIG. 4(j)), and the read operation RD or the write operation WR is performed (FIG. 4(k)). In synchronization with the activation of the access start signal ACTSZ, the access request signal AREQZ is inactivated, and the access start signal ACTSZ is self-reset (FIG. 4(l)). After this, the access end signal ACTEX is activated in response to end of the read operation RD or the write operation WR (FIG. 4(m)). In synchronization with the activation of the access end signal ACTEX, the refresh disable signal REFDISX is inactivated to the high level, and the reception of the refresh request signal RREQZ is started again (FIG. 4(n)).

Figure 5:
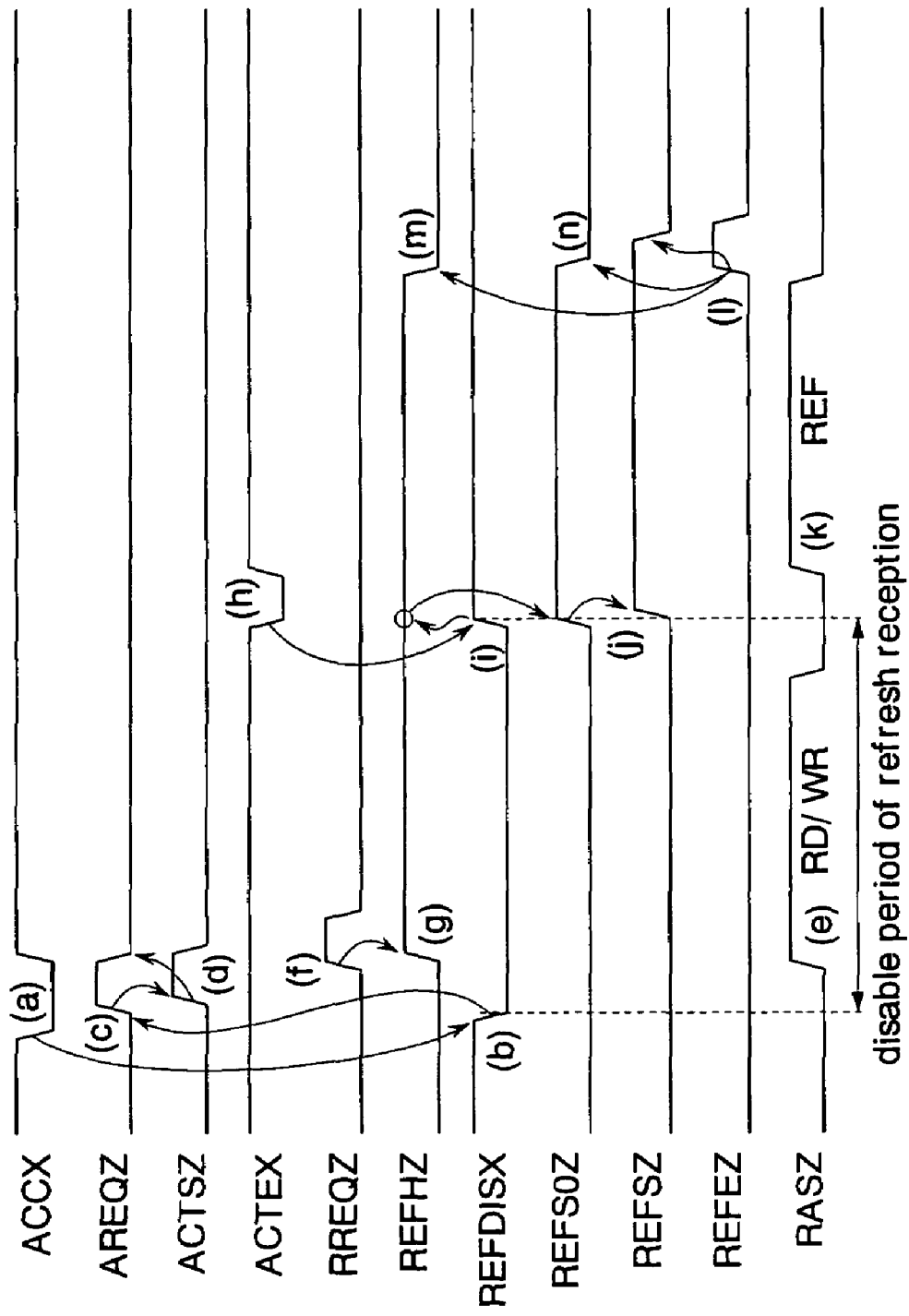
FIG. 5 is a timing chart showing another operation of the arbiter of the pseudo-SRAM set to the second specification in the first embodiment.

FIG. 5 shows another operation of the arbiter 22 of the pseudo-SRAM set to the second specification in the first embodiment. A detailed description of the same operation as in FIG. 4 is omitted. In this example, the pseudo-SRAM generates the refresh request RREQZ immediately after receiving the access request (read command RD or write command WR).

First, the access request is supplied, the access request signal ACCX is activated to the low level (FIG. 5(a)), and the refresh disable signal REFDISX is activated (FIG. 5(b)). In synchronization with the activation of the refresh disable signal REFDISX, the access request signal AREQZ is activated (FIG. 5(c)). At this time, the refresh start signal REFSZ is inactivated, so that the access start signal ACTSZ is activated in synchronization with the access request signal AREQZ (FIG. 5(d)). Then, the read operation RD or the write operation WR is performed (FIG. 5(e)). While the refresh disable signal REFDISX is activated, the reception of the refresh request RREQZ is disabled.

On the other hand, after the access request signal ACCX is activated, the refresh request RREQZ is activated (FIG. 5(f)), and the refresh hold signal REFHZ is activated (FIG. 5(g)). At this time, the refresh disable signal REFDISX is activated, so that the refresh start signal REFS0Z is not activated. Then, in response to end of the read operation RD or the write operation WR, the access end signal ACTEX is activated (FIG. 5(h)), and the refresh disable signal REFDISX is inactivated (FIG. 5(i)).

Since the refresh hold signal REFHZ is activated, the refresh start signals REFS0Z, REFSZ are activated in response to the inactivation of the refresh disable signal REFDISX (FIG. 5(j)), and the refresh operation REF is performed (FIG. 5(k)). In synchronization with completion of the performance of the refresh operation REF, the refresh end signal REFEZ is outputted (FIG. 5(l)), and the refresh hold signal REFHZ is inactivated (FIG. 5(m)). Simultaneously, the refresh start signals REFS0Z, REFSZ are inactivated (FIG. 5(n)).

Figure 6:
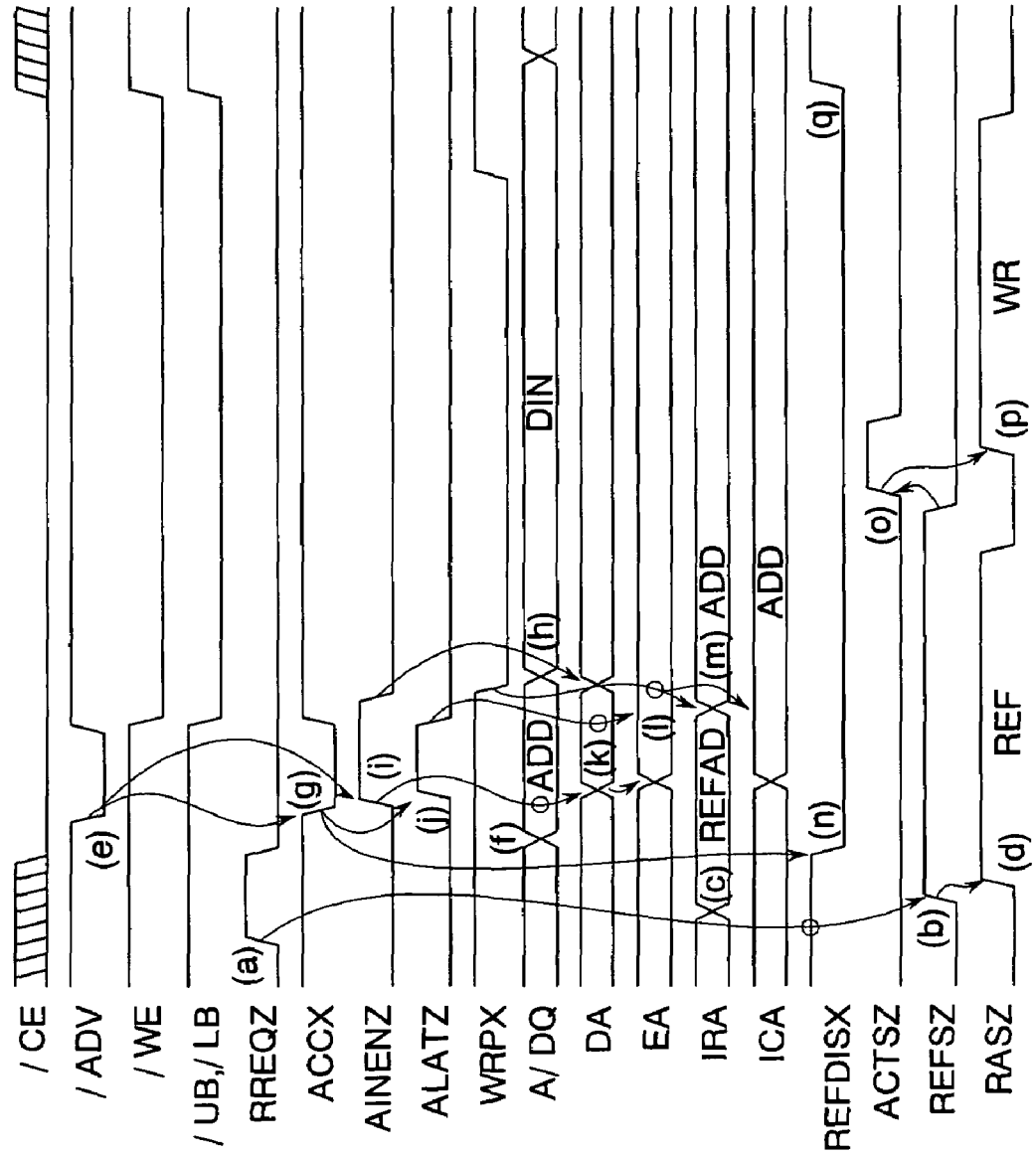
FIG. 6 is a timing chart showing an operation of the pseudo-SRAM set to the second specification in the first embodiment.

FIG. 6 shows an operation of the pseudo-SRAM set to the second specification in the first embodiment. In this example, as in FIG. 4 described above, the pseudo-SRAM generates the refresh request RREQZ immediately before receiving the write command (access request). A detailed description of the same operation as in FIG. 4 is omitted. Incidentally, in the second specification, when both the chip enable signal /CE and the address valid signal /ADV are at the valid level (low level), the access request is recognized.

For example, when plural semiconductor memory devices including the pseudo-SRAM are assigned on an address map of a system in which the pseudo-SRAM is mounted, the system decodes an address to generate a chip enable signal and supplies it to the chip enable terminal /CE. On the other hand, when only the pseudo-SRAM is assigned on the address map of the system, the system can fix the chip enable terminal /CE to the low level. In this embodiment, by forming the access detection circuit 54 and the latch circuit 66 in the timing controller 24, the pseudo-SRAM can correctly perform the read operation and the write operation even if the chip enable terminal /CE is fixed to the low level.

First, the refresh request signal RREQZ is activated in a standby state (FIG. 6(a)). Since the refresh disable signal REFDISX is inactivated, the refresh start signal REFSZ is activated in response to the refresh request REFQZ (FIG. 6(b)). The multiplexer 32 shown in FIG. 1 outputs the refresh address signal REFAD as the internal row address signal IRA during a predetermined period from the activation of the refresh start signal REFSZ (FIG. 6(c)). Then, the refresh operation REF for the memory cell MC indicated by the refresh address signal REFAD is performed (FIG. 6(d)).

After the refresh request RREQZ is generated, the address valid signal /ADV is activated to the low level for a predetermined period (FIG. 6(e)). An address signal ADD is supplied to the multipurpose terminal A/DQ in accordance with the activation period of the address valid signal /ADV (FIG. 6(f)). At this time, since the chip enable signal /CE is also activated to the low level, the external access request is recognized, and the access request signal ACCX is activated to the low level (FIG. 6(g)). After the address valid signal /ADV is inactivated, write data DIN is supplied to the multipurpose terminal A/DQ in accordance with activation of the write enable signal /WE, the upper byte control signal /UB, and the lower byte control signal /LB (FIG. 6(h)). Incidentally, which of the write request or the read request is the access request is determined by activation of the write enable signal /WE or the output enable signal /OE. In this example, the write enable signal /WE is activated, so that the write operation is performed.

In response to the activation of the address valid signal /ADV, the address input enable signal AINENZ is activated for a predetermined period (FIG. 6(*i*)). In response to the activation of the access request signal ACCX, the address latch signal ALATZ is activated for a predetermined period (FIG. 6(*j*)) The activation period of the address latch signal ALATZ is included in the activation period of the address input enable signal AINENZ.

By the activation of the address input enable signal AINENZ, the input buffers 10, 12, 14 shown in FIG. 1 are activated, and the address signal ADD supplied to the multipurpose terminal A/DQ is supplied to a delayed address signal line DA (FIG. 6(*k*)). The delayed address signal DA is supplied as the external address signal EA through the first address latch circuit 30 shown in FIG. 1 during the activation period of the address latch signal ALATZ, and latched by the first address latch circuit 30 in synchronization with inactivation of the address latch signal ALATZ (FIG. 6(*l*)). The address signal A19-0 with a short valid period supplied via the multipurpose terminals A/DQ can be converted to the external address signal EA with a long valid period by the first address latch circuit 30. Accordingly, the timing margin of the internal circuit such as the multiplexer 32 receiving the external address signal EA can be improved, and consequently the memory cell MC can be certainly accessed.

The multiplexer 32 selects the address signal ADD in place of the refresh address signal REFAD and outputs it as the internal row address signal IRA. The second address latch circuits 34, 36 latch the internal row address signal IRA and the internal column address signal ICA in synchronization with activation of the write control signal WRPX and output the latched signals to the memory cell array 50 via the row decoder 38 and the column decoder 46 (FIG. 6(*m*)).

Meanwhile, as in FIG. 4, in response to the activation of the access request signal ACCX, the refresh disable signal REFDISX is activated, and the reception of the refresh request RREQZ is disabled (FIG. 6(*n*)). In synchronization with completion of the performance of the refresh operation REF, the refresh start signal REFSZ is inactivated, and the access start signal ACTSZ is activated (FIG. 6(*o*)). Then, the write operation WR is performed (FIG. 6(*p*)). The refresh disable signal REFDISX is inactivated in response to completion of the write operation (FIG. 6(*q*)).

The above operation is performed similarly also when the read command is supplied. When the read command is supplied, the output enable signal /OE is activated in place of the write enable signal /WE, and data read from the memory cell MC is outputted to the multipurpose terminal A/DQ via the output buffer 16 shown in FIG. 1. The second address latch circuits 34, 36 operate in synchronization with the read control signal RDPX. The other operation is the same as that of the write operation shown in FIG. 6.

Figure 7:
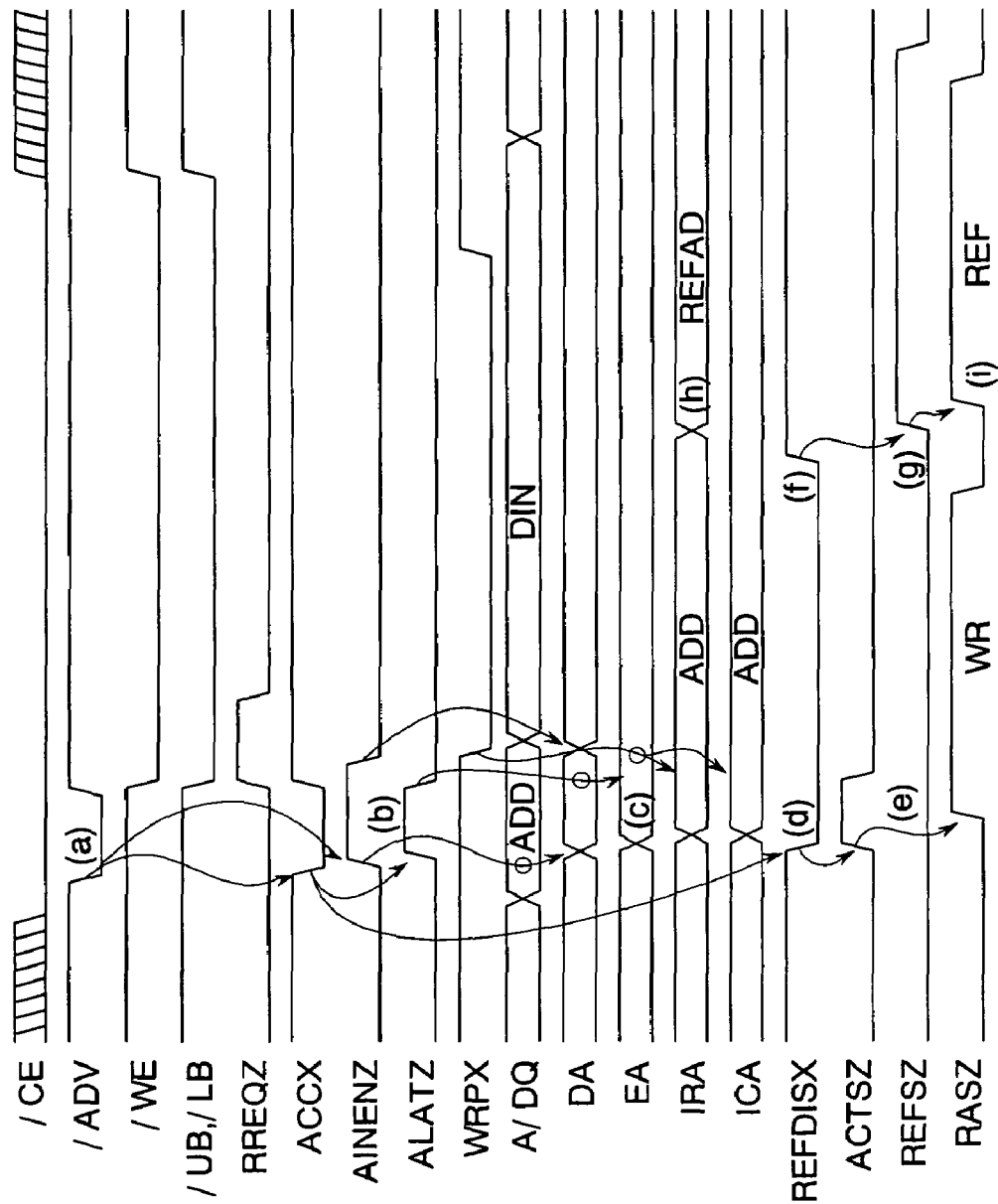
FIG. 7 is a timing chart showing another operation of the pseudo-SRAM set to the second specification in the first embodiment.

FIG. 7 shows another operation of the pseudo-SRAM set to the second specification in the first embodiment. A detailed description of the same operations as in FIG. 4 to FIG. 6 is omitted. In this example, as in FIG. 5 described above, the pseudo-SRAM generates the refresh request RREQZ immediately after receiving the write command WR (access request). The chip enable signal /CE is activated for each access or always activated.

First, the address valid signal /ADV is activated in a standby state (access request), and the access request signal ACCX is activated (FIG. 7(*a*)). In response to the activation of the address valid signal /ADV and the access request signal ACCX, the address input enable signal AINENZ and the address latch signal ALATZ are activated for a predetermined period (FIG. 7(*b*)), and as in FIG. 6, the address signal ADD is latched by the first address latch circuit 30 (FIG. 7(*c*)).

Also, in response to the activation of the access request signal ACCX, the refresh disable signal REFDISX is activated (FIG. 7(*d*)). At this time, the refresh start signal REFSZ is inactivated. Therefore, in response to the activation of the refresh disable signal REFDISX, the access start signal ACTSZ is activated, and the write operation WR is performed (FIG. 7(*e*)).

In response to completion of the write operation WR, the refresh disable signal REFDISX is inactivated (FIG. 7(*f*)). In response to the inactivation of the refresh disable signal REFDISX, the refresh start signal REFSZ is activated (FIG. 7(*g*)). The refresh address signal REFAD is outputted as the internal row address signal IRA for a predetermined period from the activation of the refresh start signal REFSZ (FIG. 7(*h*)), and the refresh operation REF is performed (FIG. 7(*i*)).

As in FIG. 6, the above operation is performed similarly also when the read command is supplied. When the read command is supplied, the output enable signal /OE is activated in place of the write enable signal /WE, and data read from the memory cell MC is outputted to the multipurpose terminal A/DQ via the output buffer 16 shown in FIG. 1. The second address latch circuits 34, 36 operate in synchronization with the read control signal RDPX. The other operation is the same as that of the write operation.

Figure 8:
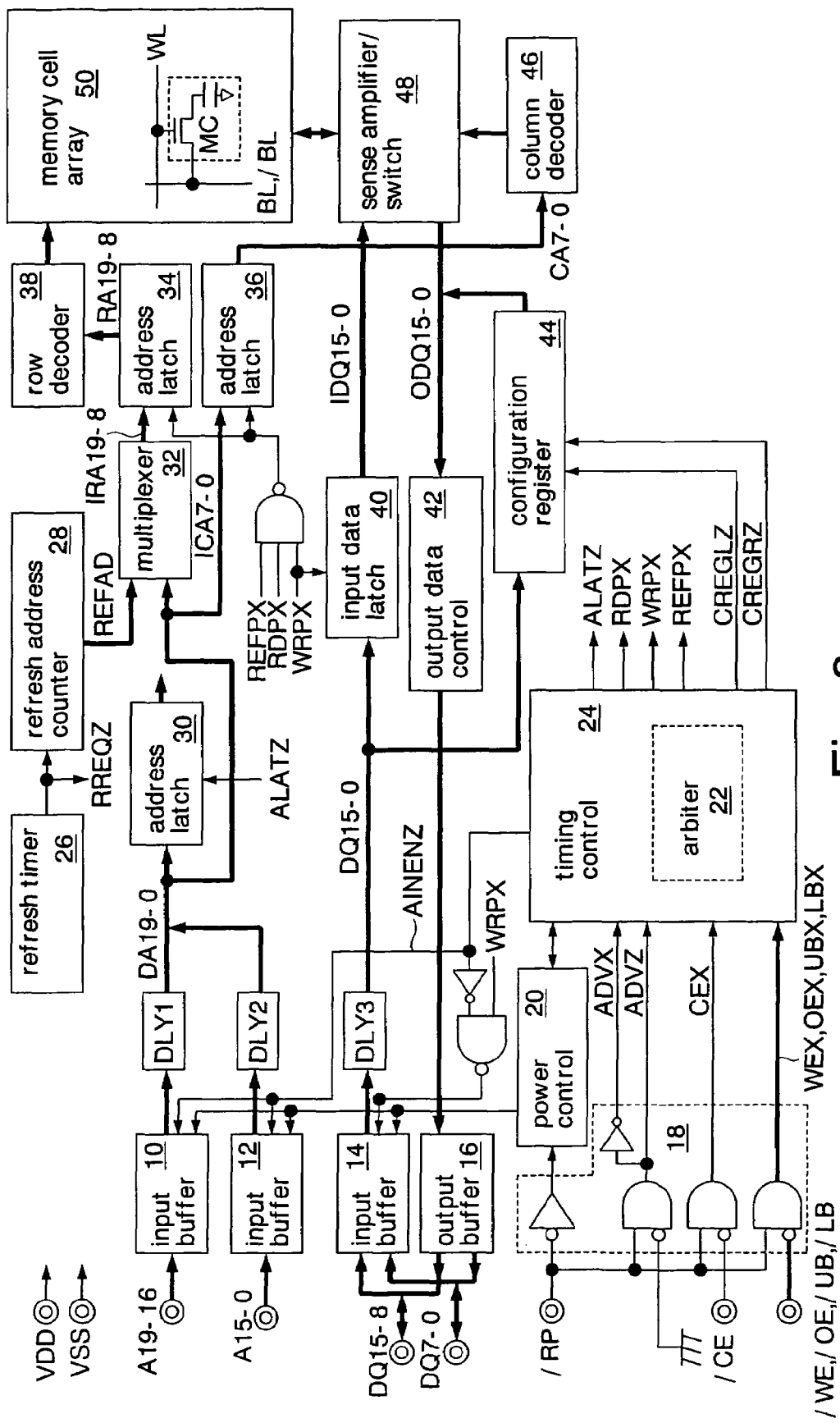
FIG. 8 is a block diagram showing a state of the pseudo-SRAM of the first embodiment set to a first specification.

FIG. 8 shows a state in which the pseudo-SRAM of the first embodiment is set to the first specification. Although not shown, the conductive pattern of each specification setting unit S1 is connected to terminal No. 1. Therefore, the input buffer 12 becomes valid and receives the address signal AD15-0, and the multipurpose terminals A/DQ connected to the input buffer 14 and the output buffer 16 are used as exclusive terminals of the data signal DQ15-0.

The delayed address signal DA19-0 outputted from the delay circuits DLY1-2 are directly supplied to the multiplexer 32 and the second address latch circuit 36 without passing through the first address latch circuit 30. The pseudo-SRAM set to the first specification receives the address signal A19-0 and the data signal DQ15-0 respectively at exclusive terminals, so that the valid period of the address signal A19-0 can be made equal to the activation period of the chip enable signal /CE. Hence, the first address latch circuit 30 which temporarily holds the address signal A19-0 is unnecessary.

In the first specification, the address signal A19-0 and the data signal DQ15-0 are respectively supplied to the exclusive terminals, and thereby the address valid terminal /ADV to identify the address signal A19-0 and the data signal DQ15-0 becomes unnecessary. Therefore, the ground voltage is supplied as the address valid signal /ADV to the command input circuit 18.

Figure 9:
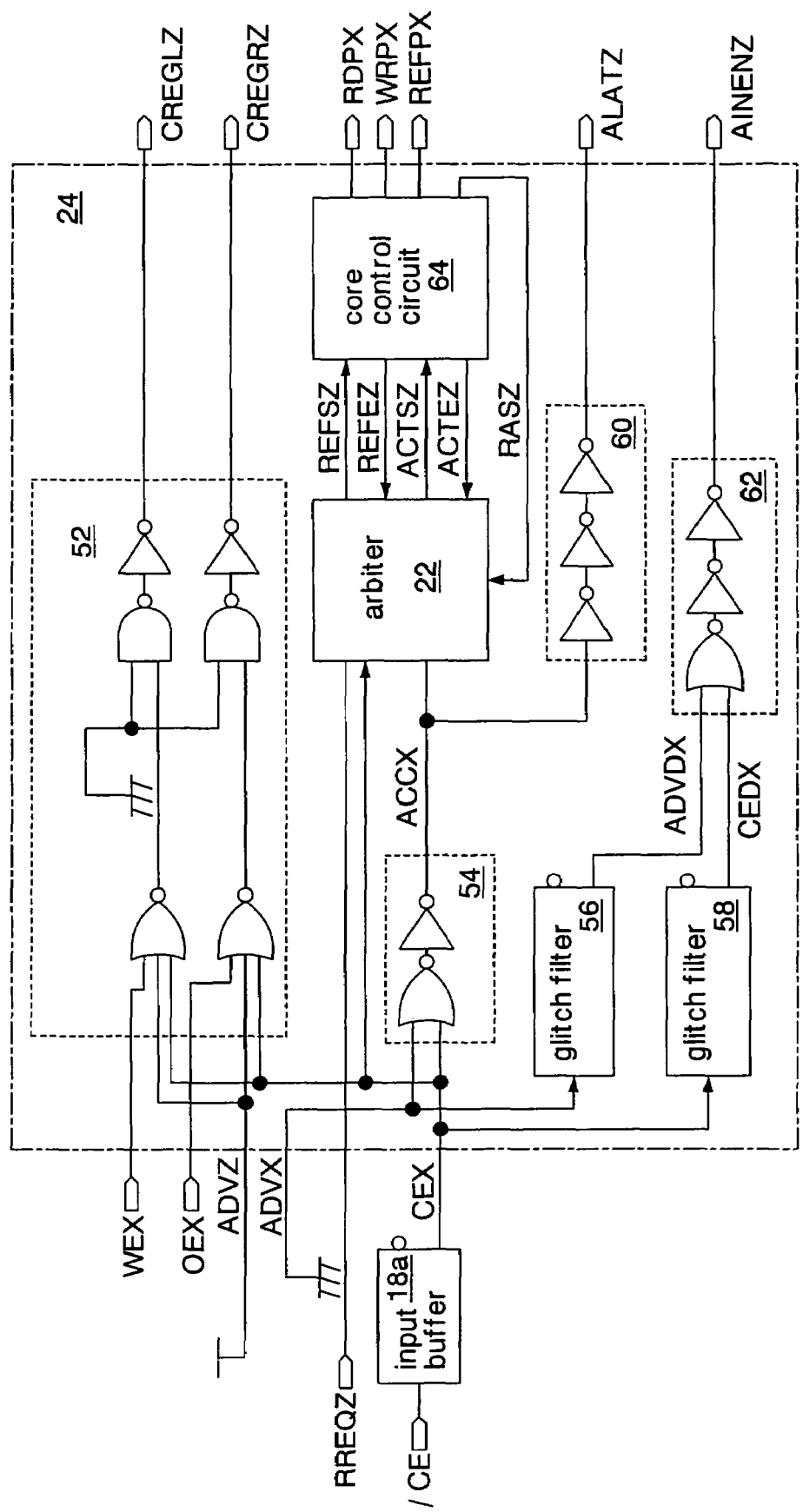
FIG. 9 is a block diagram showing a state of the timing control of the pseudo-SRAM of the first embodiment set to the first specification.

FIG. 9 shows the timing control 24 of the pseudo-SRAM set to the first specification in the first embodiment. In the first specification, a path of the address valid signal /ADV is fixed to the ground voltage, so that the access request signal ACCX, the first address latch signal ALATZ, and the address input enable signal AINENZ are generated in response to the activation of only the chip enable signal /CE. Namely, in the first specification, when only the chip enable signal /CE is at the valid level (low level), the external access request is recognized. The register latch signal GREGLZ and the register read signal GREGRZ are always inactivated. Accordingly, in the first specification, the configuration register 44 is not accessed and gets into an invalid state.

Figure 10:
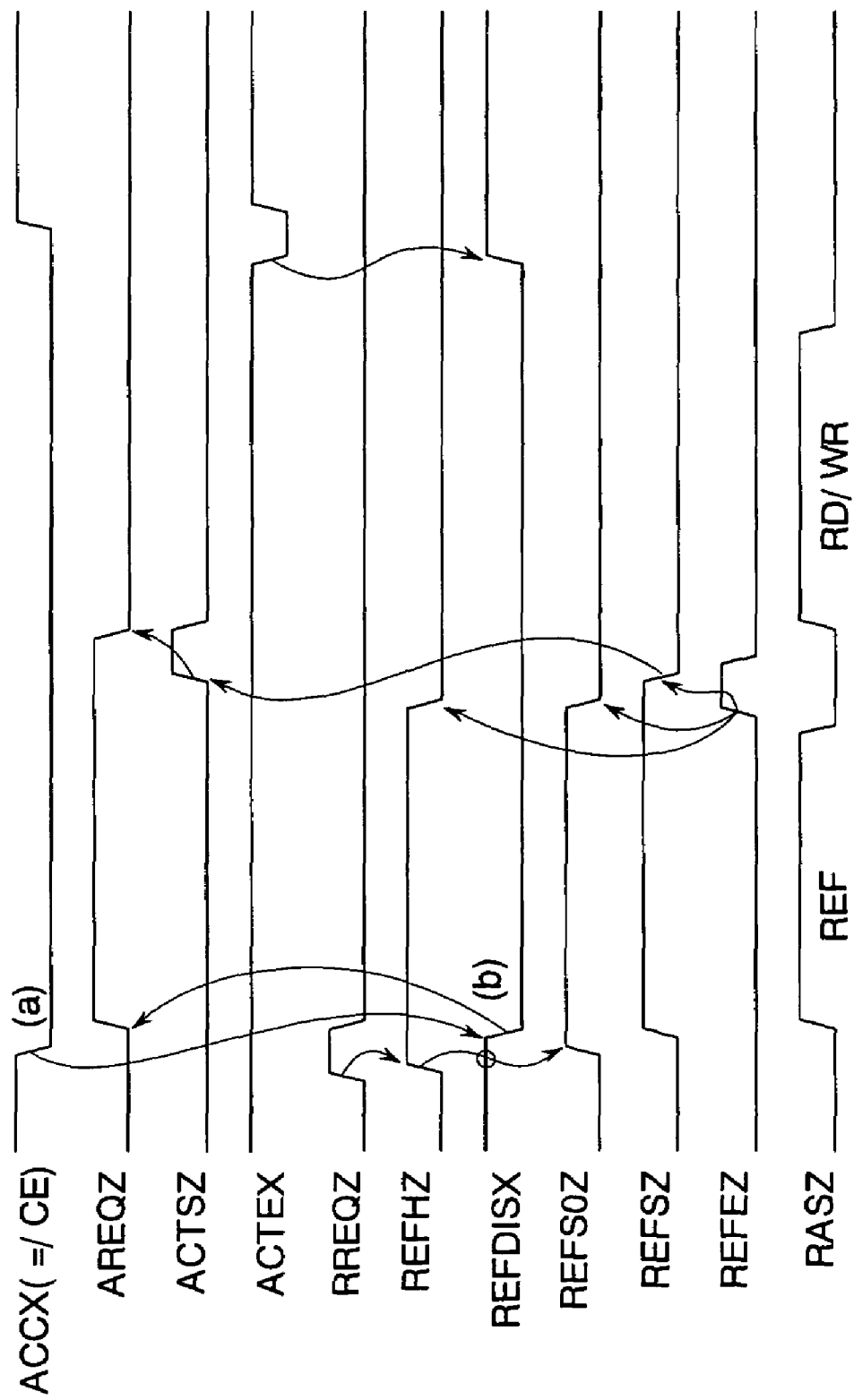
FIG. 10 is a timing chart showing an operation of an arbiter 22 of the pseudo-SRAM set to the first specification in the first embodiment.

FIG. 10 shows an operation of the arbiter 22 of the pseudo-SRAM set to the first specification in the first embodiment. In this example, as in FIG. 4 described above, the pseudo-SRAM generates the refresh request RREQZ immediately before receiving the access request (read command RD or write command WR). A detailed description of the same operation as in FIG. 4 is omitted.

The system equipped with the pseudo-SRAM activates the chip enable signal /CE for a predetermined period when accessing the pseudo-SRAM (FIG. 10(a)). The access request signal ACCX and the refresh disable signal REFDISX are activated in synchronization with activation of only the chip enable signal /CE (FIG. 10(b)). The other operation is the same as that in FIG. 4 (second specification).

Figure 11:
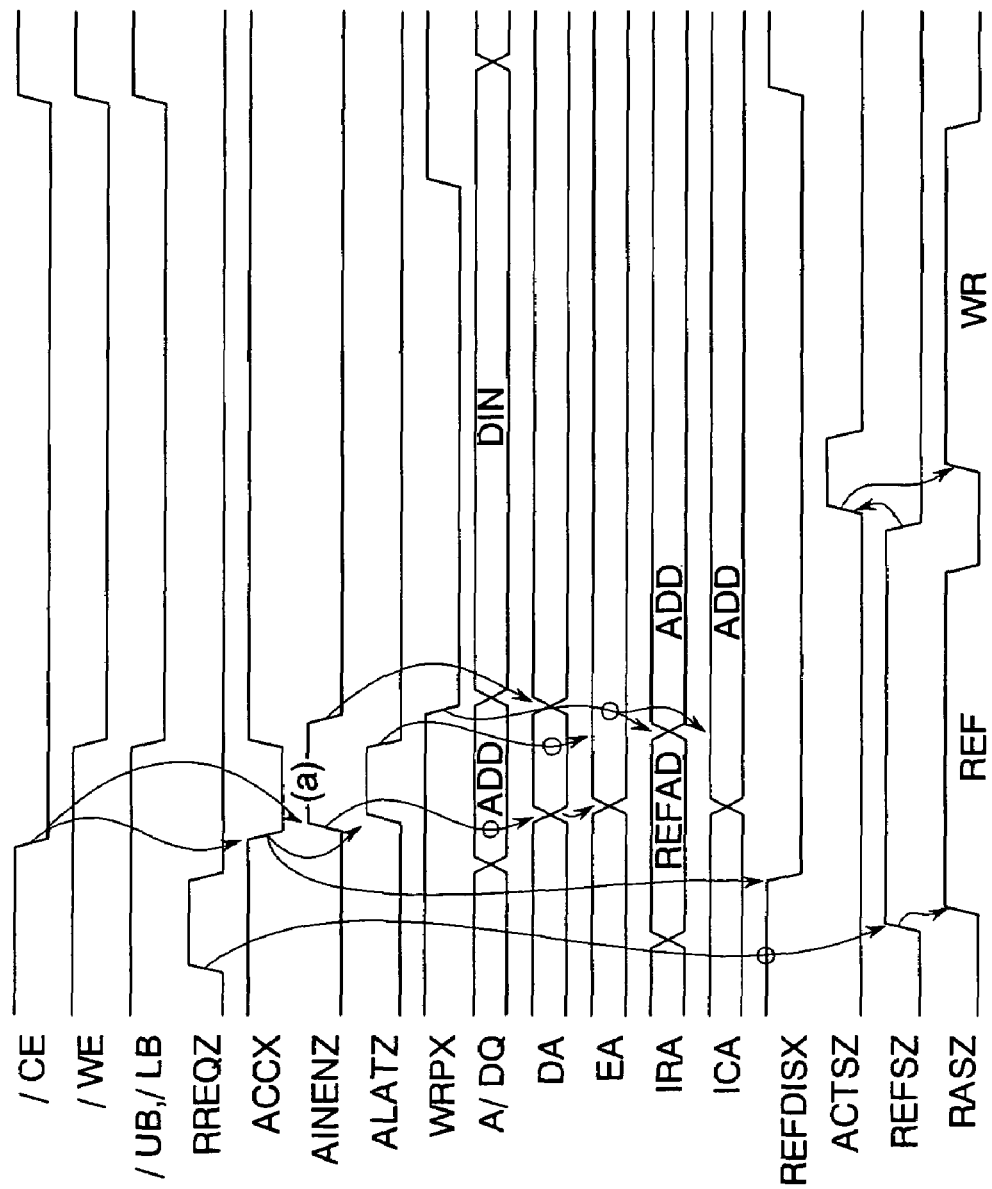
FIG. 11 is a timing chart showing an operation of the pseudo-SRAM set to the first specification in the first embodiment.

FIG. 11 shows an operation of the pseudo-SRAM set to the first specification in the first embodiment. In this example, as in FIG. 6 described above, the pseudo-SRAM generates the refresh request RREQZ immediately before the write command (access request).

In the first specification, the access request signal ACCX and the address input enable signal AINENZ are activated in response to only the chip enable signal /CE (FIG. 11(a)). The other operation is the same as that in FIG. 6, and a description thereof is omitted.

As described above, in the first embodiment, when both the chip enable signal /CE and the address valid signal /ADV reach the valid level, the external access request is detected, and during a period from this detection to the completion of the access operation, the reception of the refresh request RREQZ is disabled. Hence, in the pseudo ERAM which includes the multipurpose terminals A/DQ15-0 receiving the address signal A15-0 and the data signal DQ15-0 and identifies the supply of the address signal by the address valid signal /ADV, contention between the read operation RD and the write operation WR, and the refresh operation REF which responds to the refresh request RREQZ can be prevented. As a result, a malfunction of the pseudo-SRAM can be prevented.

The address signal A19-0 is latched by the first address latch circuit 30 in response to the access request signal ACCX generated in accordance with the external access request. Therefore, the address signal with a short valid period supplied to the multipurpose terminal A/DQ can be converted to the external address signal EA with a long valid period. By performing the read operation and the write operation using the external address signal EA, timing margin of the circuit (multiplexer 32, second address latch circuits 34, 36, or the like) which processes the address signal can be secured. This makes it possible to certainly receive the address signal and prevent the malfunction of the pseudo-SRAM caused by a defective latch and the like. Since the timing margin can be secured, the circuit design becomes easier. Further, the pseudo-SRAM becomes less likely to be affected by a change in manufacturing condition, thereby enabling an increase in yield. Furthermore, the set-up time and hold time of the address signal supplied to the multipurpose terminal A/DQ can be set to a minimum, thereby enabling a reduction in access time.

The multiplexer 32 which selects the refresh address REFAD or the external address signal EA is placed between the first address latch circuit 30 and the second address latch circuit 34. Therefore, the multiplexer 32 can select and switch between the address signal A15-0 latched by the first address latch circuit 30 and the refresh address REFAD outputted from the refresh address counter 28 with sufficient time. A margin can be generated in the timing of the internal circuit, which enables easier circuit design and increased yield.

Incidentally, if the multiplexer 32 is placed on an input side of the first address latch circuit 30, it is required to switch between the refresh address signal REFAD with the long valid period and the address signal (A19-8) with the short valid period. At this time, the multiplexer 32 needs to operate in accordance with the address signal with the short valid period, so that a sufficient timing margin cannot be secured. If the multiplexer 32 is placed on an output side of the second address latch circuit 34, the row address signal latched by the read control signal RDPX and so on needs to be further selected by the multiplexer 32. This delays the supply of the address signal to the memory cell array 50.

The product specification (operating specification) of the pseudo-SRAM is set to the first specification or the second specification according to the destination of connection of the conductive layer (specification setting unit S1) formed at the predetermined position on the semiconductor substrate corresponding to the pattern shape of the photomask. Accordingly, a circuit to switch the product specification becomes unnecessary, which can reduce the chip size of the pseudo-SRAM to a minimum. The product specification can be changed according to the set contents of the specification setting unit S1, so that two products with different operating specifications can be manufactured from one piece of design data. As a result, the development cost and manufacturing cost of the pseudo-SRAM can be reduced.

When the pseudo-SRAM of the first specification is already developed, an already existing design property can be utilized effectively by improving this pseudo-SRAM to design a pseudo-SRAM switchable between the first specification and the second specification. As a result, the design const can be reduced. Further, as concerns the photomask, by adding a sheet of photomask for a wiring process to a set of photomasks to manufacture a product, two different products can be manufactured. This can reduce manufacturing cost.

Figure 12:
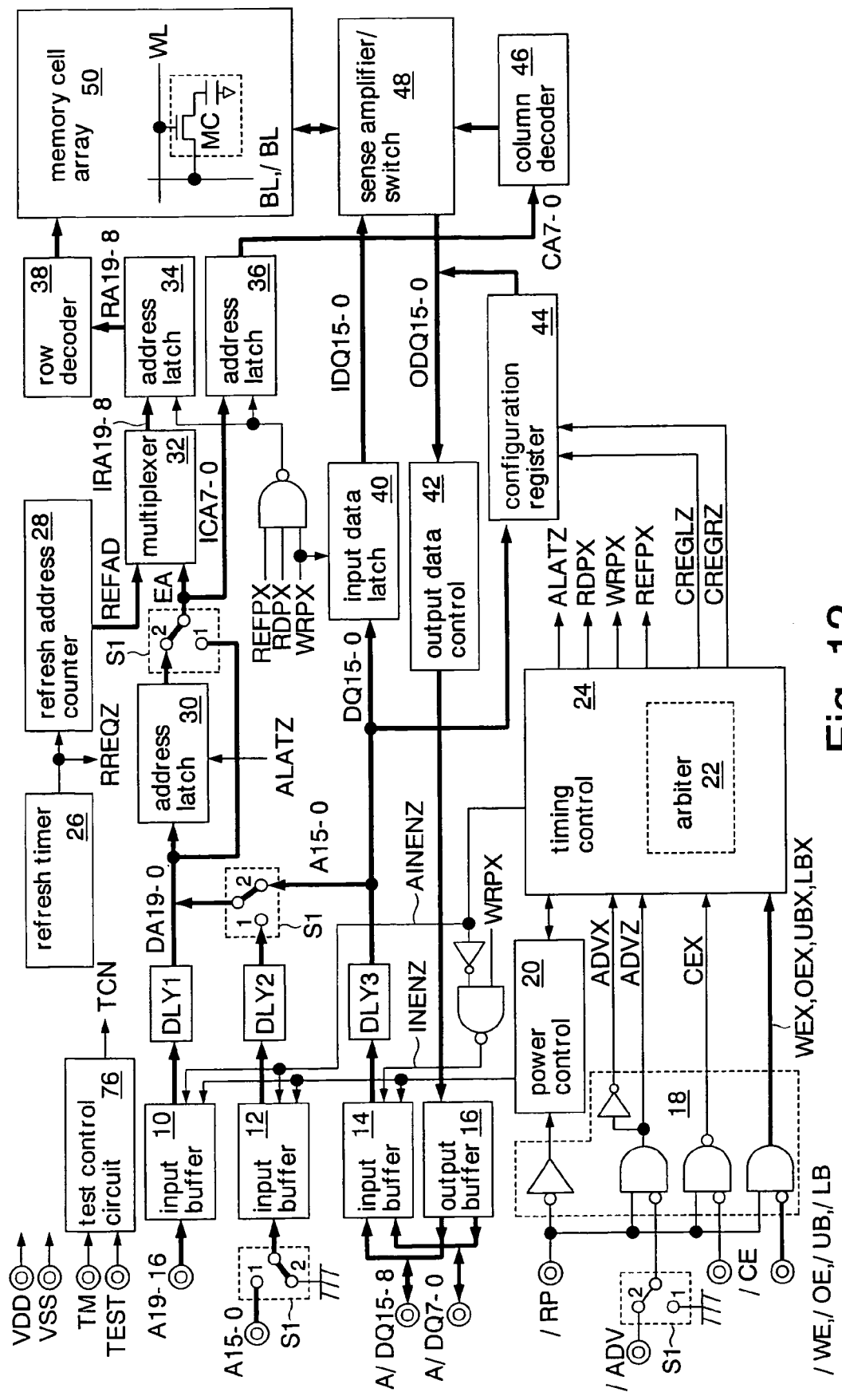
FIG. 12 is a block diagram showing a second embodiment of the semiconductor memory device of the present invention.

FIG. 12 shows a second embodiment of the semiconductor memory device of the present invention. The same symbols are used to designate the same elements as in the first embodiment, and a detailed description thereof is omitted. This semiconductor memory device is formed as a pseudo-SRAM on a silicon substrate using a CMOS process. The pseudo-SRAM is used, for example, for a work memory mounted in portable equipment such as a mobile phone.

The specification setting unit SI of this embodiment is constituted of a fuse circuit (program circuit). The pseudo-SRAM includes a test mode terminal TM, a test terminal TEST, and a test control circuit 76. The terminals TM, TEST are formed as pads to bring a probe into contact therewith in a test process of the pseudo-SRAM. Therefore, the terminals TM, TEST do not exist among external terminals of the shipped pseudo-SRAM.

The test control circuit 76 shifts from a normal operation mode in which the access operation is performed to a test mode while receiving a high level at the test mode terminal TM. At this time, the specification setting unit SI switches to the first specification or the second specification according to a logic level of the test terminal TEST regardless of a program state of the fuse circuit by a test control signal TCN outputted from the test control circuit 76. For example, while a low level is supplied to the test terminal TEST, the pseudo-SRAM is set to the first specification. While a high level is supplied to the test terminal TEST, the pseudo-SRAM is set to the second specification.

As described above, also in the second embodiment, the same effect as in the first embodiment can be obtained. Further, by constituting the specification setting unit S1 by the fuse circuit, the product specification can be set to the first specification or the second specification according to a program of a fuse. Namely, the product specification can be set after the pseudo-SRAM is manufactured. Accordingly, previously manufactured pseudo SARMs can be distributed into the first specification or the second specification according to a production plan. A change in production plan after manufacturing can be quickly coped with.

By providing the test mode terminal TM, the test signal TEST, and the test control circuit 76, the product specification can be temporarily switched to either the first specification or the second specification regardless of a program state of the fuse. Namely, it is possible to test the pseudo-SRAM while switching it between the first specification and the second specification regardless of the program state of the fuse. For example, when a test reveals that the pseudo-SRAM operates in the first specification but does not operate in the second specification, a defect can be relieved by setting this pseudo-SRAM to the first specification by the fuse circuit (specification setting unit S1). As a result, the yield can be increased, and the manufacturing cost can be reduced. Since the operating specification is freely switched, the defect analysis becomes easier.

Figure 13:
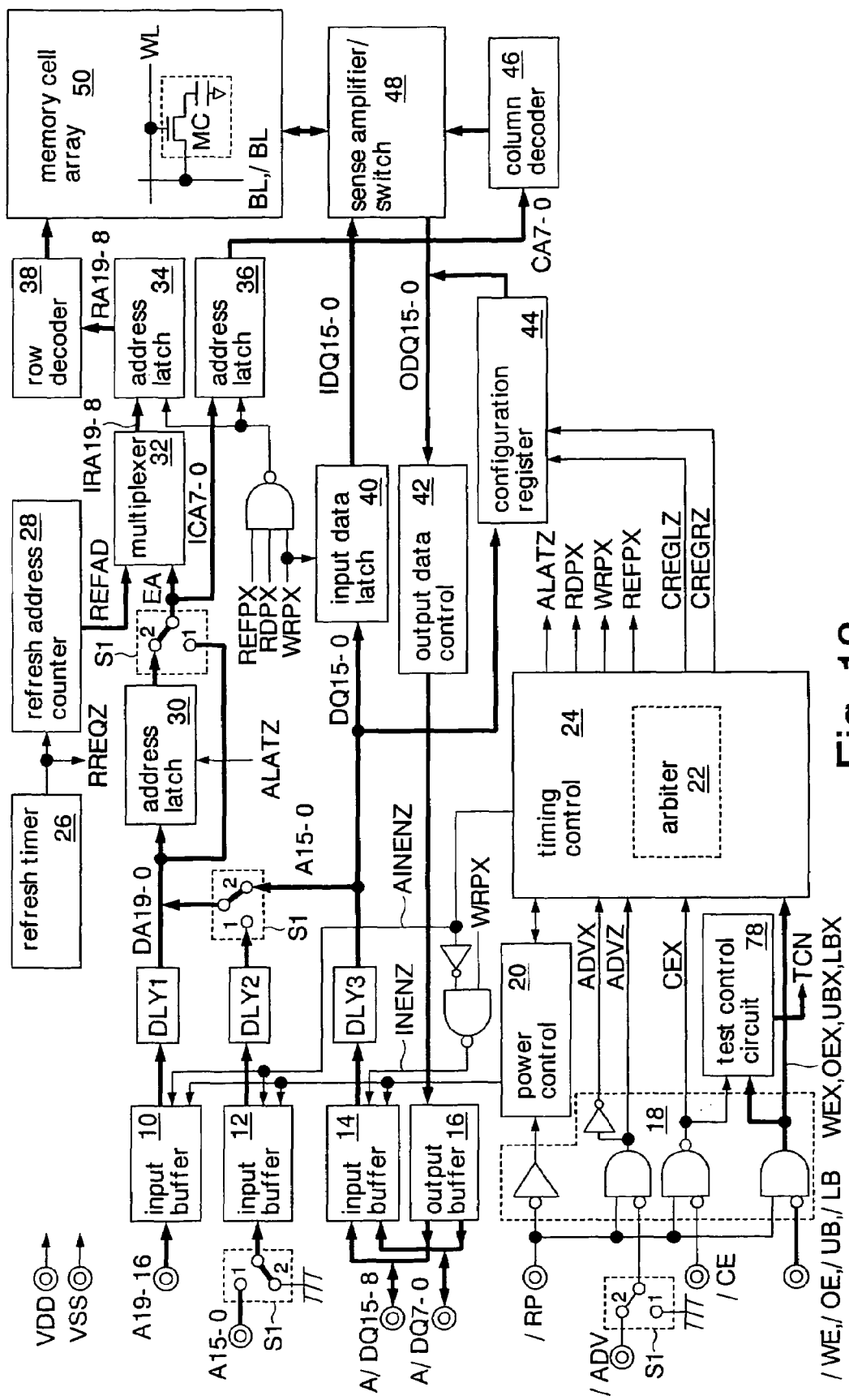
FIG. 13 is a block diagram showing a third embodiment of the semiconductor memory device of the present invention.

FIG. 13 shows a third embodiment of the semiconductor memory device of the present invention. The same symbols are used to designate the same elements as in the first embodiment, and a detailed description thereof is omitted. This semiconductor memory device is formed as a pseudo-SRAM on a silicon substrate using a CMOS process. The pseudo-SRAM is used, for example, for a work memory mounted in portable equipment such as a mobile phone.

The specification setting unit SI of this embodiment is constituted of a fuse circuit (program circuit). The pseudo-SRAM includes a test control circuit 78. When receiving a combination of command signals (/CE, /WE, /UB, /LB) not used in the normal operation, the test control circuit 78 recognizes a test command and shifts from the normal operation mode in which the access operation is performed to the test mode or from the test mode to the normal operation mode. The specification setting unit S1 switches to the first specification or the second specification according to the contents of the test command regardless of the program state of the fuse circuit by the test control signal TCN outputted from the test control circuit 78.

As described above, also in the third embodiment, the same effects as in the first and second embodiments can be obtained. Further, the pseudo-SRAM can be temporarily set to the first specification or the second specification according to the test command. Therefore, even after the pseudo-SRAM is packaged or shipped, the operating specification of the pseudo-SRAM can be switched to the first specification or the second specification regardless of the program state of the fuse circuit (specification setting unit S1).

Incidentally, in the above first embodiment, the example in which the operating specification of the pseudo-SRAM is switched to the first specification or the second specification according to the switching of the photomask is described. The present invention is not limited to this embodiment. For example, it is also possible to set the operating specification to the first specification or the second specification by designing the specification setting unit SI such that the operating specification is switched according to a supplied voltage value and connecting the other end of a bonding wire whose one end is connected to the specification setting unit S1 to a power supply line VDD or a ground line VSS in an assembly process of the pseudo-SRAM. On this occasion, as described in the second or third embodiment, it is also possible to temporarily make the set operating specification invalid and switch the operating specification to the first specification or the second specification by the test control circuit.

In the above second embodiment, the example in which the specification setting unit S1 is constituted of the fuse is described. The present invention is not limited to this embodiment. For example, the specification setting unit S1 may be constituted using an electrically programmable memory cell such as an EPROM, an EEPROM, or an FeRAM instead of the fuse.

Although the present invention is described in detail above, the above embodiments and their modified examples are merely illustrative of the invention, and the present invention is not limited to these. It is understood that various modifications may be made without departing from the scope of the present invention.

By applying the present invention to a semiconductor memory device which includes an address valid terminal and automatically performs refresh, a malfunction of the semiconductor memory device due to contention between a refresh operation and an access operation can be prevented.

The invention is not limited to the above embodiments and various modifications may be made without departing from the spirit and scope of the invention. Any improvement may be made in part or all of the components.

What is claimed is:

1. A semiconductor memory device, comprising:
a memory cell array including dynamic memory cells;
a refresh request circuit generating an internal refresh request in a predetermined cycle;
a chip enable terminal receiving a chip enable signal which is made valid when said memory cell array is accessed;
an address valid terminal receiving an address valid signal indicating that an address signal indicating a memory cell to be accessed is supplied;
a terminal which receives the address signal when the address valid signal has a valid level, and receives a data signal to be written into a memory cell when the address valid signal has an invalid level;
an access detection circuit detecting an external access request when both said chip enable signal and said address valid signal have a valid level; and
an arbiter determining which of said external access request and said internal refresh request is given priority, disabling reception of said internal refresh request in response to the detection by said access detection circuit, and enabling the reception of said internal refresh request in response to completion of a read operation or a write operation corresponding to the received chip enable signal and address valid signal.

2. The semiconductor memory device according to claim 1, further comprising:
an access command terminal receiving at least either of a read command to read data from a memory cell and a write command to write data into a memory cell;
a latch signal generation circuit activating a first address latch signal in response to the detection by said access detection circuit;
a first address latch circuit receiving and latching said address signal in response to the activation of said first address latch signal and outputting it as an external address signal; and
a second address latch circuit latching said external address signal in synchronization with the reception of said read command or said write command and outputting the latched signal to said memory cell array.

3. The semiconductor memory device according to claim 1, further comprising:

a refresh address counter sequentially generating refresh address signals in synchronization with said internal refresh request the refresh address signals each indicating a memory cell to be refreshed, and a multiplexer placed between said first address latch circuit and said second address latch circuit and supplying either said external address signal or the refresh address signal to said second address latch circuit, wherein said second address latch circuit lathes the address signal selected by said multiplexer.

4. A semiconductor memory device, comprising:
a memory cell array including dynamic memory cells;
a refresh request circuit generating an internal refresh request in a predetermined cycle;
a multipurpose terminal receiving an address signal indicating a memory cell to be accessed and a data signal to be written into a memory cell;
an exclusive address terminal receiving only an address signal;
a chip enable terminal receiving a chip enable signal which is made valid when said memory cell array is accessed;
an address valid terminal receiving an address valid signal indicating that a signal supplied to said multipurpose terminal is said address signal;
an access detection circuit detecting an external access request when both said chip enable signal and said address valid signal reach a valid level;
an arbiter determining which of said external access request and said internal refresh request is given priority; and a specification setting unit setting an operating specification to either of a first specification and a second specification,
wherein: in said first specification, while said address valid terminal is made invalid, only said data signal is received by said multipurpose terminal, said exclusive address terminal is made valid, and said arbiter disables reception of said internal refresh request when detecting that said chip enable signal is at the valid level, enables the reception of said internal refresh request in response to completion of a read operation or a write operation corresponding to the received chip enable signal; and
in said second specification, while said address valid terminal is made valid, said address signal and said data signal are received by said multipurpose terminal, said exclusive address terminal is made invalid, and said arbiter disables reception of said internal refresh request in response to the detection by said access detection circuit, and enables the reception of said internal refresh request in response to completion of a read operation or a write operation corresponding to the received chip enable signal and address valid signal.

5. The semiconductor memory device according to claim 4, wherein: said specification setting unit includes a conductive layer formed at a predetermined position on a semiconductor substrate in accordance with a pattern shape of a photomask used in a semiconductor manufacturing process; and
said operating specification is set to said first specification or said second specification according to a signal path formed of said conductive layer.

6. The semiconductor memory device according to claim 4, wherein: said specification setting unit includes a program circuit; and
said operating specification is set to said first specification or said second specification according to information programmed in said program circuit.

7. The semiconductor memory device according to claim 6, further comprising:

a test mode terminal receiving a test mode signal; and
a test terminal receiving a test signal, wherein when said test mode signal indicates a valid level, said specification setting unit switches said operating specification to either one of said first specification and said second specification according to a logic level of said test signal regardless of a set state of said program circuit.

8. The semiconductor memory device according to claim 6, further comprising a test control circuit shifting an operating state to a test mode when receiving a combination of signals not used in a normal operation, wherein during said test mode, said specification setting unit switches said operating specification to either one of said first specification and said second specification according to a test signal regardless of a set state of said program circuit.

9. The semiconductor memory device according to claim 4, further comprising:
a refresh address counter sequentially generating refresh address signals in synchronization with said internal refresh request the refresh address signals each indicating a memory cell to be refreshed, and a multiplexer placed between said first address latch circuit and said second address latch circuit and supplying either said external address signal or the refresh address signal to said second address latch circuit, wherein said second address latch circuit latches the address signal selected by said multiplexer.

10. The semiconductor memory device according to claim 4, further comprising:
an access command terminal receiving at least either of a read command to read data from a memory cell and a write command to write data into a memory cell; a latch signal generation circuit activating a first address latch signal in response to the detection by said access detection circuit;
a first address latch circuit receiving and latching said address signal in response to the activation of said first address latch signal and outputting it as an external address signal; and
a second address latch circuit latching either said address signal or said external address signal in synchronization with the reception of said read command or said write command and outputting the latched signal to said memory cell array, wherein said second address latch circuit latches said address signal in said first specification, and latches said external address signal in said second specification.

11. The semiconductor memory device according to claim 10, wherein: said specification setting unit includes a conductive layer formed at a predetermined position on a semiconductor substrate in accordance with a pattern shape of a photomask used in a semiconductor manufacturing process; and said operating specification is set to said first specification or said second specification according to a signal path formed of said conductive layer.

12. The semiconductor memory device according to claim 10, wherein: said specification setting unit includes a program circuit; and said operating specification is set to said first specification or said second specification according to information programmed in said program circuit.

13. The semiconductor memory device according to claim 12, further comprising:
a test mode terminal receiving a test mode signal; and
a test terminal receiving a test signal, wherein when said test mode signal indicates a valid level, said specification setting unit switches said operating specification to either one of said first specification and said second specification according to a logic level of said test signal regardless of a set state of said program circuit.

14. The semiconductor memory device according to claim 12, further comprising a test control circuit shifting an operating state to a test mode when receiving a combination of signals not used in a normal operation, wherein during said test mode, said specification setting unit switches said operating specification to either one of said first specification and said second specification according to a test signal regardless of a set state of said program circuit.

* * * * *